United States Patent
Kozlowski et al.

(10) Patent No.: US 7,046,284 B2
(45) Date of Patent: May 16, 2006

(54) CMOS IMAGING SYSTEM WITH LOW FIXED PATTERN NOISE

(75) Inventors: Lester J. Kozlowski, Simi Valley, CA (US); Markus Loose, Thousand Oaks, CA (US)

(73) Assignee: Innovative Technology Licensing LLC, Thousand Oaks, CA (US)

( * ) Notice: Subject to any disclaimer, the term of this patent is extended or adjusted under 35 U.S.C. 154(b) by 0 days.

(21) Appl. No.: 10/776,952

(22) Filed: Feb. 11, 2004

(65) Prior Publication Data

US 2005/0068439 A1    Mar. 31, 2005

Related U.S. Application Data

(60) Provisional application No. 60/507,397, filed on Sep. 30, 2003.

(51) Int. Cl.
    *H04N 5/335* (2006.01)

(52) U.S. Cl. .................................. 348/308; 348/241

(58) Field of Classification Search ................ 348/308, 348/241, 300, 301, 294, 303, 302; 250/208.1; 341/144, 155
    See application file for complete search history.

(56) References Cited

U.S. PATENT DOCUMENTS

| | | | |
|---|---|---|---|
| 5,148,268 A * | 9/1992 | Tandon et al. | ............... 348/303 |
| 5,248,971 A | 9/1993 | Mandl | |
| 5,382,977 A | 1/1995 | Kozlowski et al. | |
| 5,471,515 A | 11/1995 | Fossum et al. | |
| 5,880,460 A | 3/1999 | Merrill | |
| 5,892,540 A | 4/1999 | Kozlowski et al. | |
| 5,929,434 A | 7/1999 | Kozlowski et al. | |
| 6,115,066 A | 9/2000 | Gowda et al. | |
| 6,417,504 B1 | 7/2002 | Kozlowski | |
| 6,441,357 B1 * | 8/2002 | Ang et al. | ............... 250/208.1 |
| 6,456,326 B1 | 9/2002 | Fossum et al. | |
| 6,476,374 B1 | 11/2002 | Kozlowski et al. | |
| 6,483,116 B1 | 11/2002 | Kozlowski et al. | |
| 6,493,030 B1 | 12/2002 | Kozlowski et al. | |
| 6,498,331 B1 | 12/2002 | Kozlowski et al. | |
| 6,504,141 B1 | 1/2003 | Kozlowski et al. | |
| 6,532,040 B1 * | 3/2003 | Kozlowski et al. | ......... 348/241 |
| 6,535,247 B1 | 3/2003 | Kozlowski et al. | |
| 6,538,245 B1 | 3/2003 | Kozlowski | |

(Continued)

OTHER PUBLICATIONS

Youxin Gao; D.F. Wong, "Wire-sizing for Delay Minimization and Ringing Control Using Transmission Line Model" Department of Computer Sciences, University of Texas at Austin, Austin, Texas 78712.

K. Chen, M. Afghahi, P.E. Danielsson, C. Svensson "PASIC: A Processor-A/D converter—Sensor Integrated circuit"; 1990 IEEE, pp. 1705-1708.

(Continued)

*Primary Examiner*—Aung Moe
(74) *Attorney, Agent, or Firm*—Doyle B. Johnson; Reed Smith LLP

(57) ABSTRACT

A CMOS imager system including an active pixel sensor having an access supply which provides distributed feedback, a column buffer (having gain and FPN suppression), and an A/D converter co-located with the sensor such that the effective transmission path between the column buffer (or optional analog PGA) and the A/D converter acts as a resistor, rather than a reactance. The system may further include both an analog gain amplifier stage and a digital programmable amplifier stage.

14 Claims, 12 Drawing Sheets

U.S. PATENT DOCUMENTS

| | | | |
|---|---|---|---|
| 6,566,697 B1 | 5/2003 | Fox et al. | |
| 6,583,817 B1 | 6/2003 | Lee | |
| 6,587,142 B1 | 7/2003 | Kozlowski et al. | |
| 6,624,850 B1 | 9/2003 | Guidash | |
| 6,677,996 B1* | 1/2004 | Chung et al. | 348/308 |
| 6,697,111 B1* | 2/2004 | Kozlowski et al. | 348/302 |
| 6,809,767 B1* | 10/2004 | Kozlowski et al. | 348/308 |
| 6,888,572 B1* | 5/2005 | Kozlowski | 348/308 |
| 2002/0047934 A1* | 4/2002 | Nitta et al. | 348/642 |
| 2003/0133627 A1* | 7/2003 | Brehmer et al. | 382/308 |
| 2004/0135911 A1* | 7/2004 | Nathan et al. | 348/308 |
| 2004/0252209 A1* | 12/2004 | Loose | 348/255 |

OTHER PUBLICATIONS

Keping Chen, Per-Erik Danielsson, Anders Astrom "PASIC A Sensor/Processor Array For Computer Vision"; 1990 IEEE, pp. 352-366.

Boyd Fowler, Abbas El Gamal, David X.D. Yang "A CMOS Area Image Sensor with Pixel-Level A/D Conversion"; 1994 IEEE International Solid-State Conference, pp. 226-227.

M. Degrauwe, E. Vittoz, I. Verbauwhede, "A Micropower CMOS-Instrumentation Amplifier" IEEE Journal of Solid-State Circuits, vol. SC-20, No. 3, Jun. 1985, pp. 805-807.

* cited by examiner

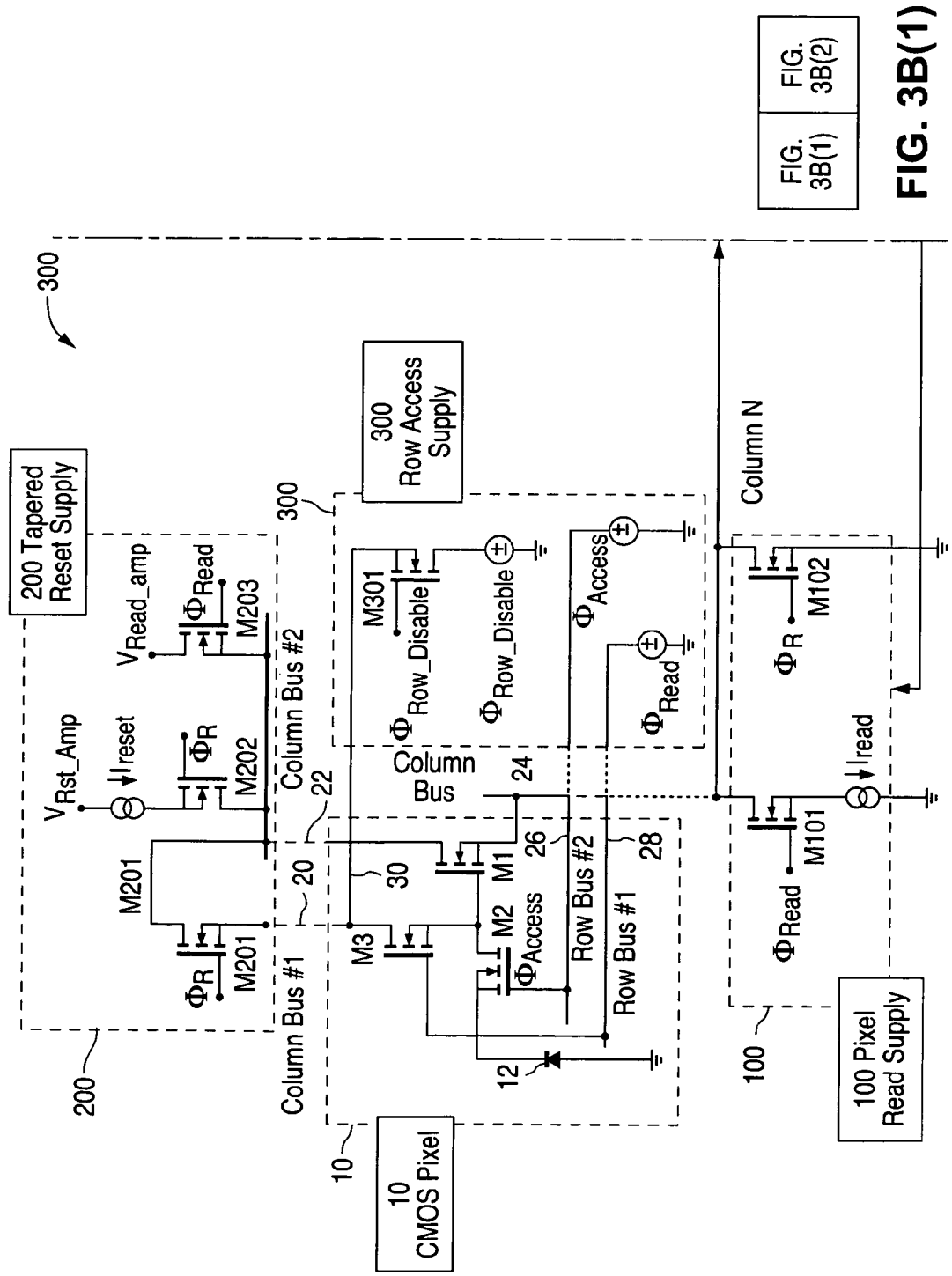
FIG. 3B(1)

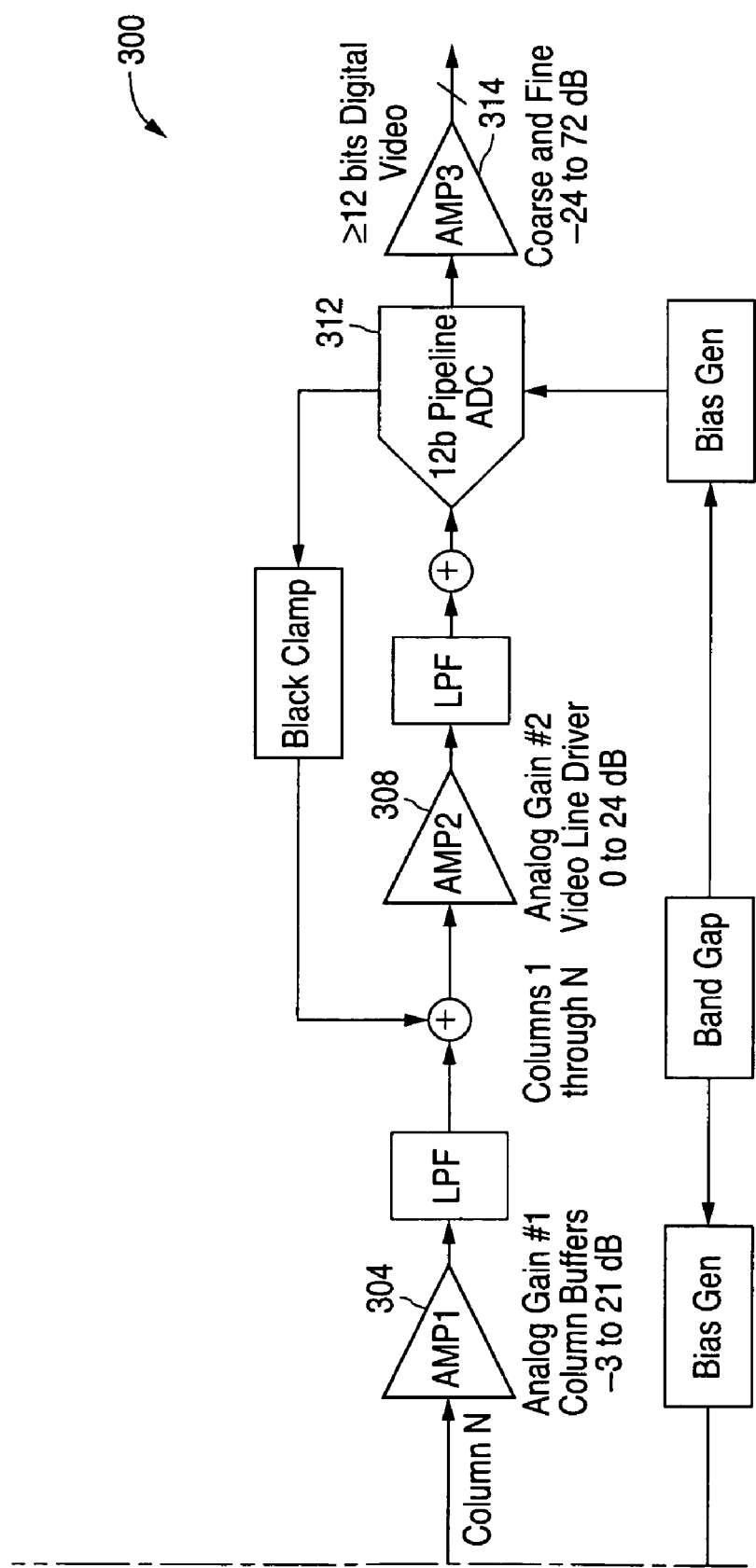
FIG. 3B(2)

CMOS IMAGING SYSTEM WITH LOW FIXED PATTERN NOISE

This application claims the benefit of U.S. Provisional Application No. 60/507,397, filed Sep. 30, 2003, entitled CMOS IMAGING SYSTEM WITH LOW FIXED PATTERN NOISE, the disclosure of which is herein incorporated by reference.

BACKGROUND OF THE INVENTION

1. Field of the Invention

The present invention relates generally to CMOS imaging devices, and more particularly to an imaging system-on-chip implementation for producing high performance image sensors having high resolution, low power dissipation and noise.

2. Description of the Related Art

Visible imaging systems implemented in CMOS significantly reduce video camera cost and power by efficiently combining the image sensor with the ancillary components including drive electronics and output signal conditioning electronics. A video camera, for example, can be configured as a single CMOS integrated circuit supported by only an oscillator and a battery. Such a CMOS imaging system-on-chip requires lower voltages and dissipates less power than a CCD-based system with supporting camera system. These improvements translate into smaller camera size, longer battery life, and applicability to many new products.

The advantages offered by CMOS visible imagers have spurred considerable effort to develop active-pixel sensor (APS) devices. Active-pixel sensors with on-chip analog and/or digital signal processing can provide low temporal noise comparable or superior to scientific grade CCD systems. CMOS active-pixel circuits, on the other hand, can increase fixed pattern noise (possibly requiring additional camera circuitry to suppress the noise) and limit image sensor scalability to preclude producing sufficiently high resolution to produce digital images having quality comparable to photographic film.

Consequently, the CMOS image sensor design must optimize the entire architecture starting at the pixel through the on-chip digitizer to produce the highest quality video stream. Much prior art addresses only one or few aspects of the imaging system-on-chip to constrain the overall challenge. Prior art in the late 1960's to the late 1980's strove to optimize the total solution without having access to modern deep submicron CMOS processes by various means including 3-D assembly to incorporate on-focal plane A/D conversion, gain and offset compensation, and image sensor control. More recent prior art used amalgamated CCD/CMOS technology or inchoate CMOS technology to architect system-on-chip solutions.

For example, U.S. Pat. No. 6,456,326 suppresses pixel-based fixed pattern noise by applying conventional correlated double sampling to a relatively complex pixel design that offers low temporal noise, but does not achieve overall fixed-pattern noise below 0.2% (Col. 5, Line 23). Alternative image sensors that are competitive to incumbent CCDs must have fixed pattern noise at least an order of magnitude lower. Nevertheless, no means is taught to suppress the column-based noise produced by either the subsequent column-based signal conditioning or A/D conversion. Moreover, scalability and compatibility with foundry processes are not taught since floating gates transparent to visible wavelengths of interest are not generally available. The result in FIG. 2 is unsatisfactory quantum efficiency less than 10% in the blue region. Furthermore, the sampling node is vulnerable to signal discharge due to stray light and this parasitic effect degrades the quality of the captured image.

U.S. Pat. No. 5,471,515 also teaches an active pixel to facilitate lower temporal and spatial noise that is similarly incompatible with scaling and production at leading foundries using conventional CMOS image sensor processes. It is critical that the photogate be transparent to broadband radiation, yet supporting gate materials such as Indium Tin Oxide (ITO) are unavailable with mainstream CMOS technology. This incompatibility applies as well to U.S. Pat. No. 6,624,850 taught by Guidash, but the latter is more scalable by using only four transistors in each pixel.

U.S. Pat. No. 5,880,460 teaches means for suppressing pixel-based noise and the camera-on-chip noise specifically generated by sampling power supply noise on a row-by-row basis. Here the common mode signal is subtracted to reduce total read noise to the level set only by the pixel design, but no means is supplied to suppress the noise of the subsequent signal conditioning that is downstream of the pixel.

Fox in U.S. Pat. No. 6,566,697 teaches a pixel design potentially compatible with CMOS foundry production, but the method has limited scalability to smaller pixel pitch to produce multi-megapixel imager format since it comprises five transistors. Implementation of the pinned diode can also be problematic with conventional CMOS process technology since low voltage operation results in a charge transfer barrier between the diode and the sampling node 18 as shown in FIG. 3C that manifests image lag. Further, the high impedance node 18 both generates reset noise and is vulnerable to pickup of feed-through offsets that create fixed pattern noise.

In addition to optimum pixel design, a low-noise CMOS imaging system-on-chip requires support circuits to manage the photo-generated signal from each pixel. U.S. Pat. No. 5,471,515 shows one method for handling the signal and reset levels from each pixel to facilitate correlated double sampling. Guidash teaches pixel miniaturization in combination with the downstream circuit means of U.S. Pat. No. 5,471,515 by combining clocking functions to remove one transistor from each pixel. Unfortunately, these methodologies again work best when supported with transparent gate technology.

Further downstream, the CMOS imaging system-on-chip requires on-chip digitization. Mainstream methods include column-wise A/D conversion as taught by Chen ("PASIC: A processor-A/D converter sensor integrated circuit" in Circuits and Systems, 1990, IEEE International Symposium on, 1–3 May 19 pp 1705–1708 vol. 3) to produce a camera-on-chip implementation including timing controller; or Chen, ("PASIC. A sensor/processor array for computer vision," Proceedings of the International Conference on Application Specific Array Processors, 5–7 Sep. 1990, pp. 352–366) to facilitate very high frame rates. By having a relatively low-speed A/D converter at each column, such as also taught by Gowda in U.S. Pat. No. 6,115,066, the total video frame rate can be very high. Mitigation of non-uniformities between the many digitizers, however, requires global calibration via means such as taught by Lee in U.S. Pat. No. 6,583,817. Another problem is the relative high power dissipation of this technology path since each ADC's power dissipation is high compared to higher speed digitizers. The quiescent operating point for low-speed through high-speed converters requires basic power dissipation levels that weakly depend on digitization frequency. Basic power efficiency hence degrades as the digitization is made less global, such as by migrating from one converter per sensor, to several converters per sensor, to one converter per column (Chen), and to one converter per pixel (for example, as taught by Mandl in U.S. Pat. No. 5,248,971 and Fowler (ISSCC Digest of Technical Papers, San Francisco, Calif., February 1994).

As disclosed in U.S. Pat. No. 6,493,030, herein incorporated by reference, a scalable high-performance low-noise amplifier system for a CMOS image sensor that can be produced in standard CMOS process technology may be formed as shown in FIG. 1. Each pixel 10 in a sensor array (not shown) comprises a photodetector 12, such as a photodiode, for example, connected to the gate of a dual-driver MOSFET 14, and one leg of a reset MOSFET 16. The other leg of MOSFET 16 is connected to a leg of MOSFET 14 and a leg of MOSFET 20. MOSFET 20 acts as a current source during global reset and as a switch during pixel readout. A row select MOSFET 18 has one leg connected to MOSFET 14 and the other leg connected to column bus 24. Column bus 24 connects all the pixels in a column of the photodetector array by way of the row select MOSFET 18 to a source supply 30. Row bus 22 connects all the pixel resets in a row to an access supply $V_{dd}$. Tapered reset supply 50 supplies an optimized active-pixel reset waveform, as disclosed in the U.S. Pat. No. 6,493,030 patent and illustrated in FIG. 2, to the gate of MOSFET 16.

Reset is initiated by filly enabling the row select MOSFETs 18 of the pixels in the selected row, thereby connecting a low-impedance voltage source (located in source supply 30) to one leg of MOSFET 14 for all the pixels in the row. An embodiment of the source supply 30 is shown in FIG. 6. Dual purpose MOSFET 20 is biased as a current source by waveform $V_{bias}$ on gate 26 so that all the pixel amplifiers in the imager are configured as transimpedance amplifiers with capacitive feedback provided by MOSFET'S 14 Miller capacitance. MOSFET 14 thus acts as a transconductance, and reset MOSFET 16 acts as a resistance controlled by the tapered reset supply 50. The series resistance of MOSFET 16 is gradually increased by applying a decreasing ramp waveform to the gate of MOSFET 16 to give the feedback transconductance of MOSFET 14 the opportunity to null the reset noise (kTC).

As described, MOSFET 20 is configured as a P-FET (see FIGS. 5 and 6 of the U.S. Pat. No. 6,493,030 patent), whereas the other transistors are N-FETs. In such a configuration, the distributed feedback amplifier is a simple inverter, and provides the gain necessary to facilitate the tapered reset noise suppression mechanism to suppress the reset noise.

As disclosed in U.S. Pat. No. 5,892,540, herein incorporated by reference, a high-performance low-noise amplifier system is formed that minimizes column-based fixed pattern noise while competently handling the signal from each pixel on a column-by-column basis. The read out circuit for each column of pixels includes a high gain, wide bandwidth, CMOS differential amplifier, a reset switch and selectable feedback capacitors, selectable load capacitors, correlated double sampling and sample-and-hold circuits, an optional pipelining circuit, and an offset cancellation circuit connected to an output bus to suppress the input offset non-uniformity of the column amplifier.

SUMMARY OF THE INVENTION

In general, the present invention is a CMOS imaging system whose performance is limited only by the temporal noise floor of the CMOS pixel. Since each pixel's active pixel sensor comprises a distributed feedback amplifier sequentially configured as a simple source follower during pixel readout or as a cascoded inverter during pixel reset that is subsequently read by a low-noise column-based amplifier that adds neither temporal noise nor fixed pattern noise, the pixel's extremely low noise floor of <3 electrons is largely independent of video rate and superior to other CMOS or CCD imaging sensors. By subsequently digitizing the multiplexed signal from the column buffers with one or relatively few high-speed A/D converters in close proximity to the final video buffer, the sensor's performance is still limited only by the temporal noise floor of the CMOS pixel and the chip power dissipation is the lowest possible for the specific video rate.

Specifically, in one embodiment, the present circuit comprises three transistors having the same polarity, and a photodetector for each pixel. The present circuit is compact and compatible with pixel pitch below 3 µm using 0.18 µm CMOS fabrication technology. Being a distributed inverter amplifier wherein amplifier components are located both within the pixel and outside of the pixel, the present circuit is compact and compatible with pixel pitch below 3 µm using 0.18 µm CMOS fabrication technology. An access supply connected to the active pixel circuit is a current source that acts as a distributed feedback amplifier, when it is connected to the pixel transistors. The access supply connects to an access MOSFET that isolates a common node from an output node. The system further includes a column buffer, having programmable gain and automatic fixed-pattern noise (FPN) suppression, a video buffer having programmable gain and bandwidth, and a highly efficient A/D converter co-located with the sensor, such that the effective transmission path between the final video buffer and the A/D converter acts primarily as a resistance, rather than a reactance.

BRIEF DESCRIPTION OF THE DRAWINGS

The present invention will be readily understood by the following detailed description in conjunction with the accompanying drawings, wherein like reference numerals designate like structural elements, and in which:

FIG. 3B is the block diagram of FIG. 3A, including the pixel and supporting circuit elements of the representative embodiment;

DETAILED DESCRIPTION OF THE INVENTION

Figure 1:
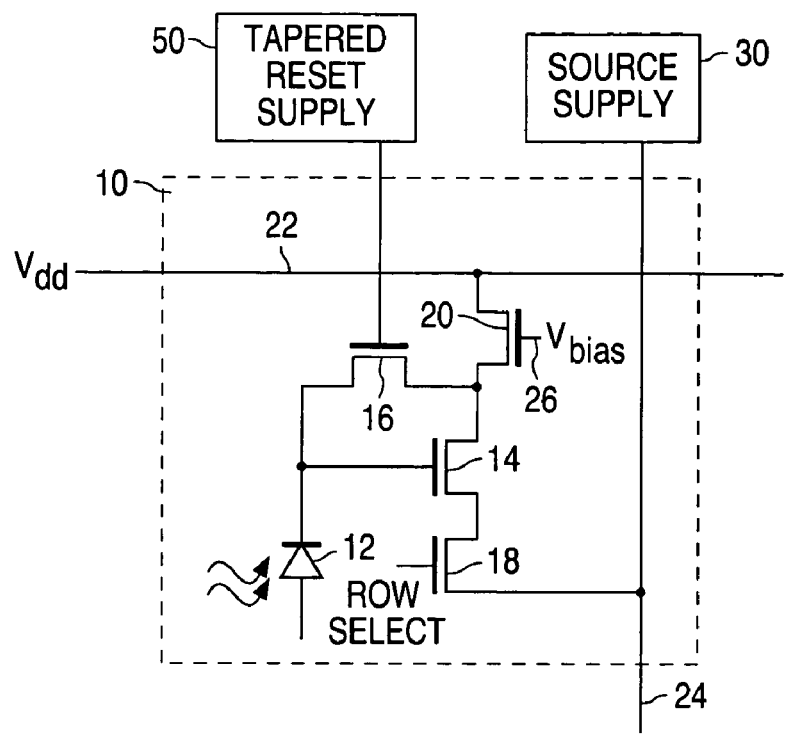
FIG. 1 is a block diagram of a prior art circuit.

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a low noise imaging system with low fixed-pattern noise. Any and all such modifications, equivalents and alternatives are intended to fall within the spirit and scope of the present invention.

The present invention has the advantages of full process compatibility with standard salicided (self-aligned silicide) submicron CMOS. This helps maximize yield and minimize die cost because the circuit complexity is distributed amongst the active-pixels and peripheral circuits, and exploits signal-processing capability inherent to CMOS. The invention's spectral response encompasses the near-ultraviolet (400 nm) to the near-IR (>950 nm).

Because the low-noise system of the present invention has as few as three MOSFETs in each pixel, the invention offers as-drawn optical fill factor >50% at 5 µm pixel pitch using 0.25 µm design rules in CMOS. The invention's fill factor is still above 40% at 3.9 µm pixel pitch using 0.18 µm design rules. The actual optical fill factors are somewhat larger due to lateral collection and the large diffusion length of commercial CMOS processes. A final advantage is the flexibility to collocate digital logic and signal-processing circuits due to its high immunity to electromagnetic interference. When fully implemented in a desired camera-on-a-chip architecture, the low-noise active pixel sensor (APS) can provide temporal read noise below 3 e− (at data rates compatible with either high definition television video or still photography via electronic means), fixed pattern noise significantly below 0.02% of the maximum signal (on a par with competing CCD imagers), <0.5% non-linearity, $\geq$1.5 V signal swing for 3.3 V power supply, large charge-handling capacity, and variable sensitivity using simple serial interface updated on a frame-by-frame basis via digital interface to a host microprocessor.

A prototype embodiment of the low-noise APS invention formed a visible imager comprising an array of 1920 (columns) by 1080 (rows) of visible light detectors (photodetectors). The rows and columns of pixels were spaced 5 microns center-to-center using standard 0.25 µm design rules to provide 50% as-drawn optical fill factor. Subsequent layouts using 0.18 µm rules show that the invention provides similar fill factor at about 4 µm pitch. Several columns and rows of detectors at the perimeter of the light-sensitive region were covered with metal and used to establish the dark level for off-chip signal processing. In addition, the detectors in each row were covered with color filters to produce color imagers. For example, the odd rows may begin at the left with red, green, then blue filters, and the even rows may begin with blue, red, then green filters, with these patterns repeating to fill the respective rows.

Figure 3A:
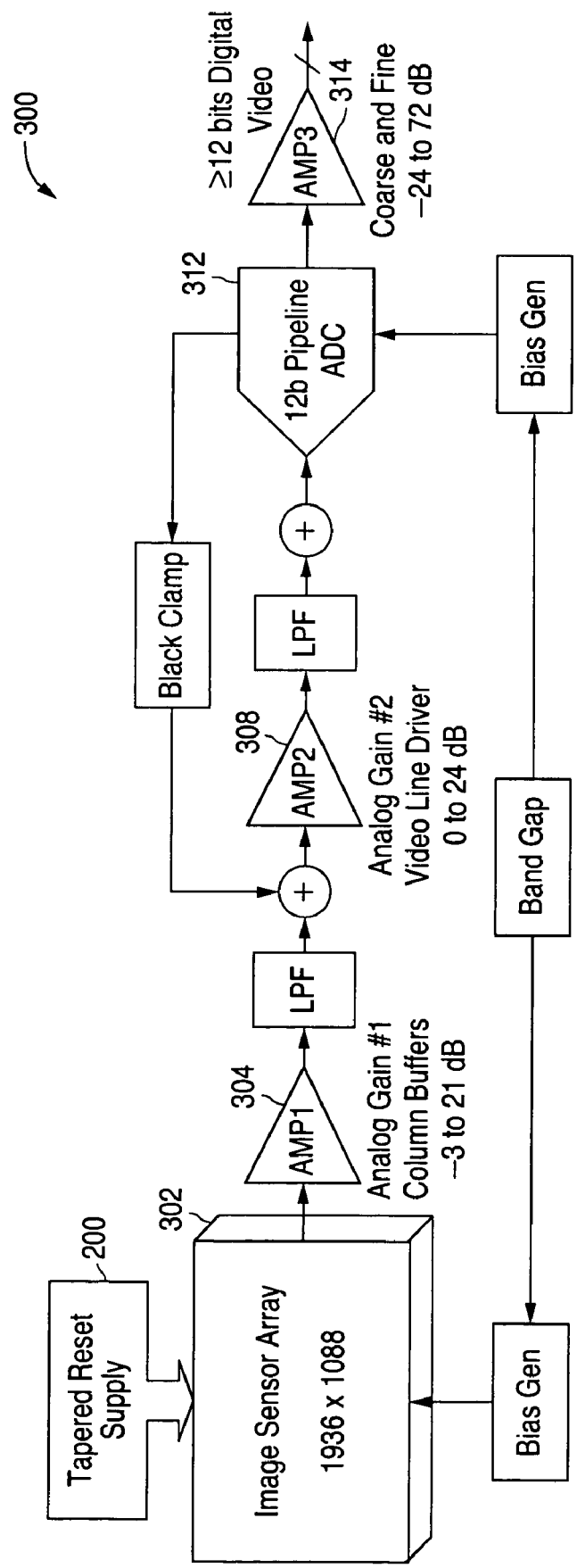
FIG. 3A is a simplified end-to-end block diagram of a representative embodiment of the present invention.

A block diagram of the basic invention is shown in FIG. 3A. The imaging system 300 consists of compact active pixels 302 whose noise is minimized by applying tapered reset 200 (such as U.S. Pat. Nos. 6,493,030 and 6,535,247), a supporting column buffer 304 (having gain and fixed-pattern noise (FPN) suppression), optional analog programmable gain amplifier 308 with tunable electronic bandwidth, and closely located high-speed A/D conversion 312 having $\geq$12 bit resolution to best support the pixel's dynamic range of at least 12 bits and as much as 14 bits at 5 µm pixel pitch. The $\geq$12 bit A/D conversion is preferably a single pipeline unit to minimize power dissipation and allow scalable resolution by programming the number of operating stages. A digital programmable gain stage 314, such as taught by U.S. patent application Ser. No. 10/460,014, entitled DIGITAL PROGRAMMABLE GAIN STAGE WITH HIGH RESOLUTION FOR CMOS IMAGE SENSORS, filed Jun. 11, 2003, the disclosure of which is herein incorporated by reference, may be used to adjust the gain of the final output. FIG. 3B further shows an implementation of FIG. 3A, including a schematic of the pixel sensor, as shown in FIG. 7.

Figure 4:
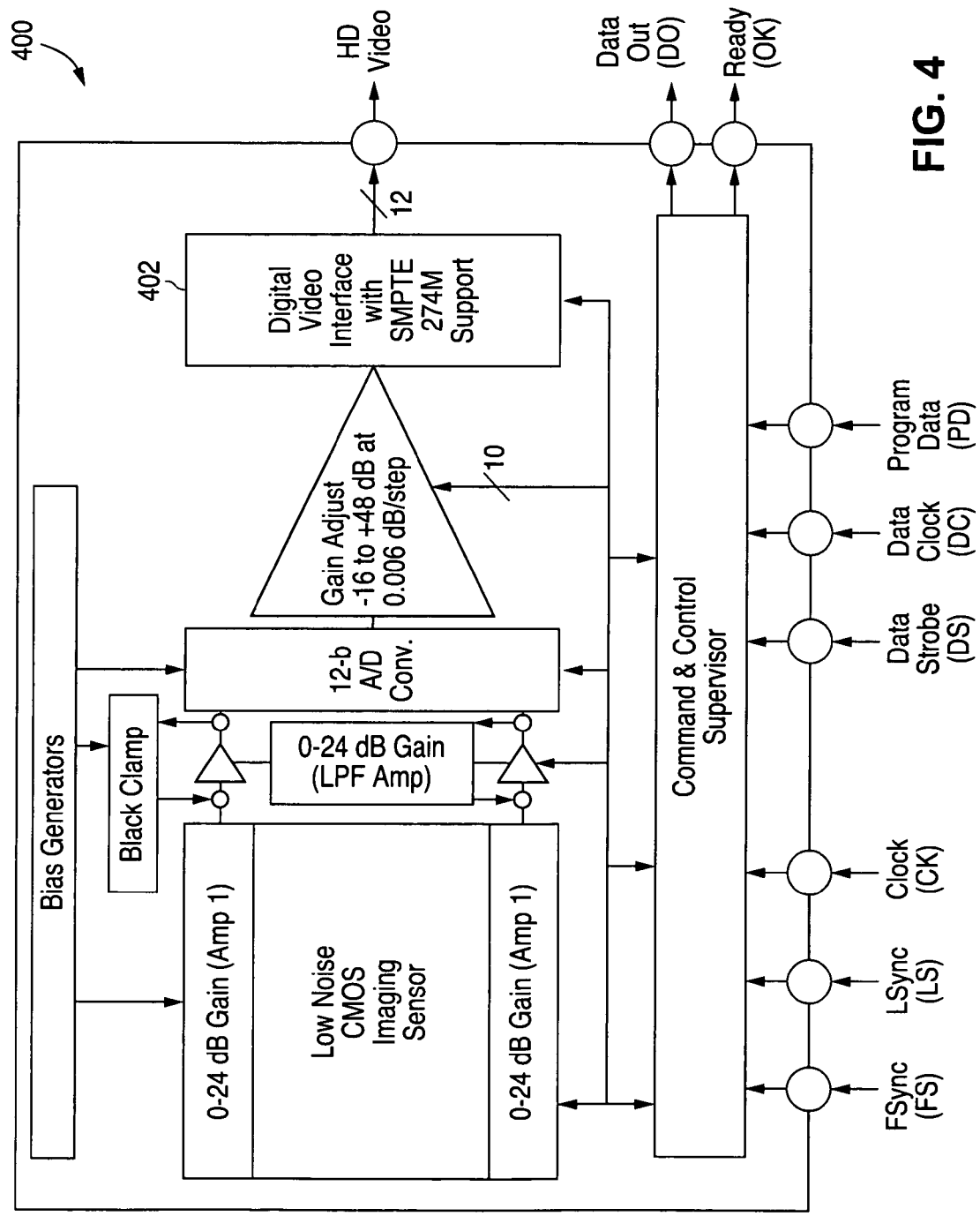
FIG. 4 is a more detailed block diagram of one embodiment of the present invention.
Figure 5A:
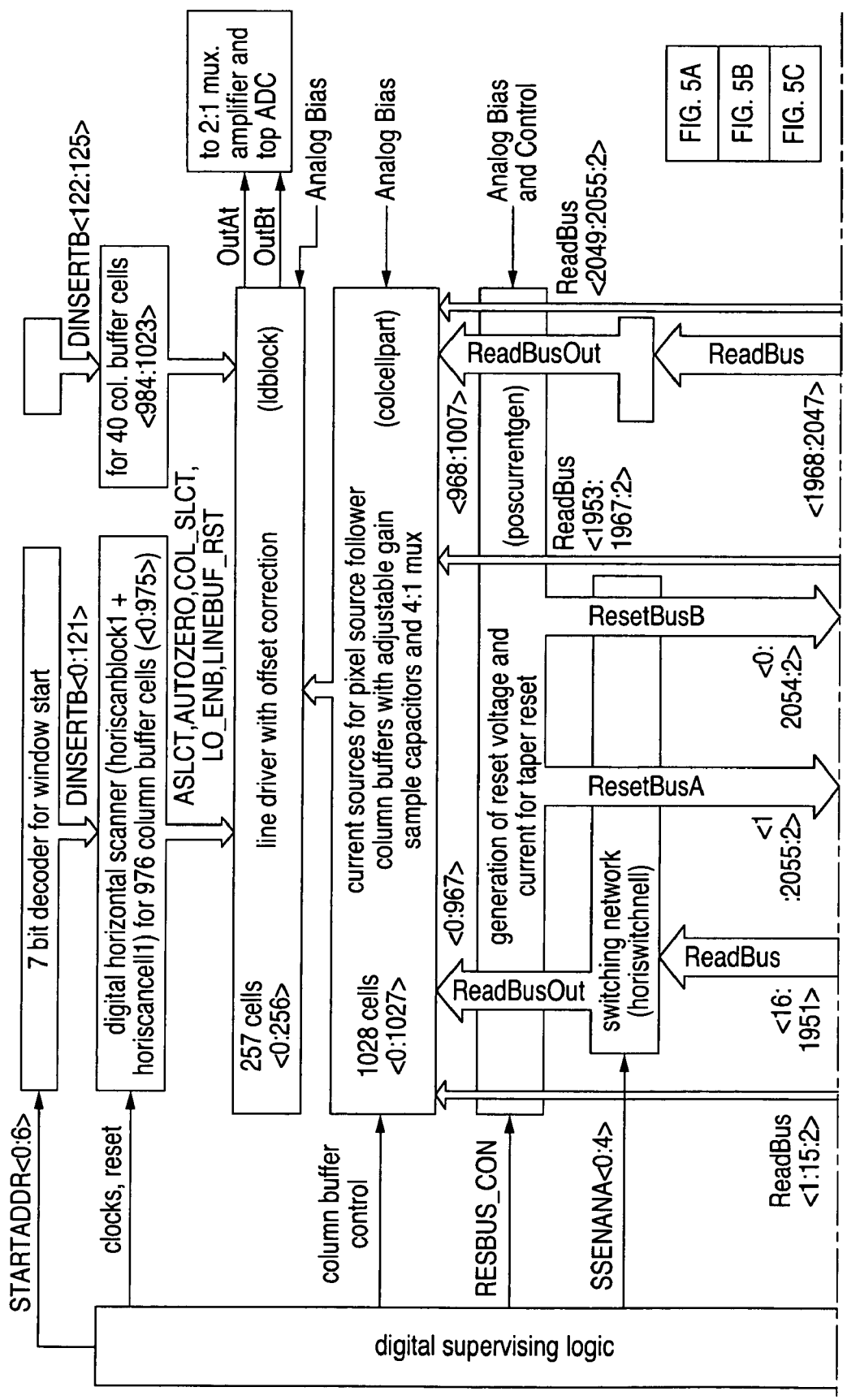
FIG. 5 is a low-level block diagram of an embodiment of the present invention.
Figure 5B:
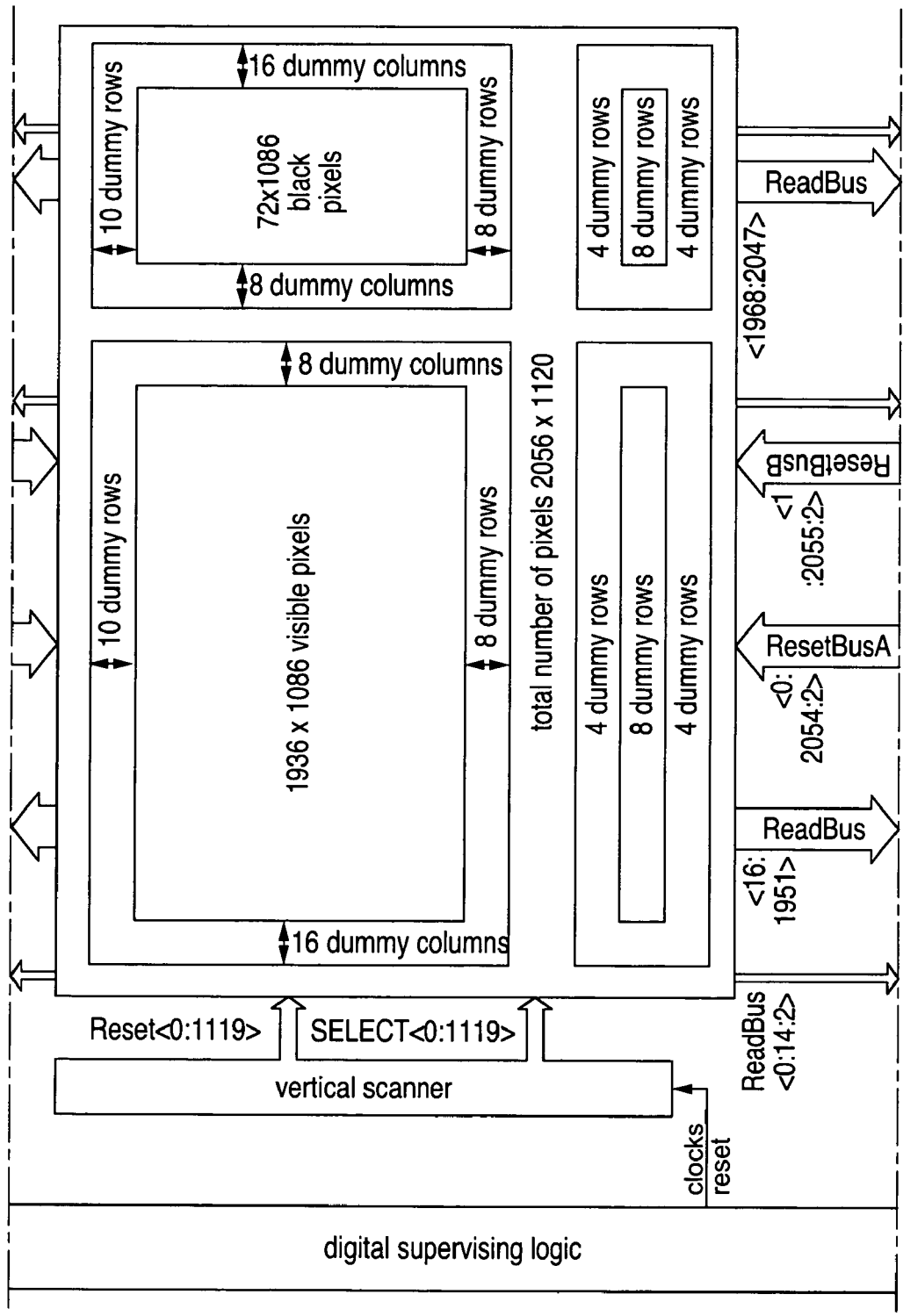
Figure 5C:
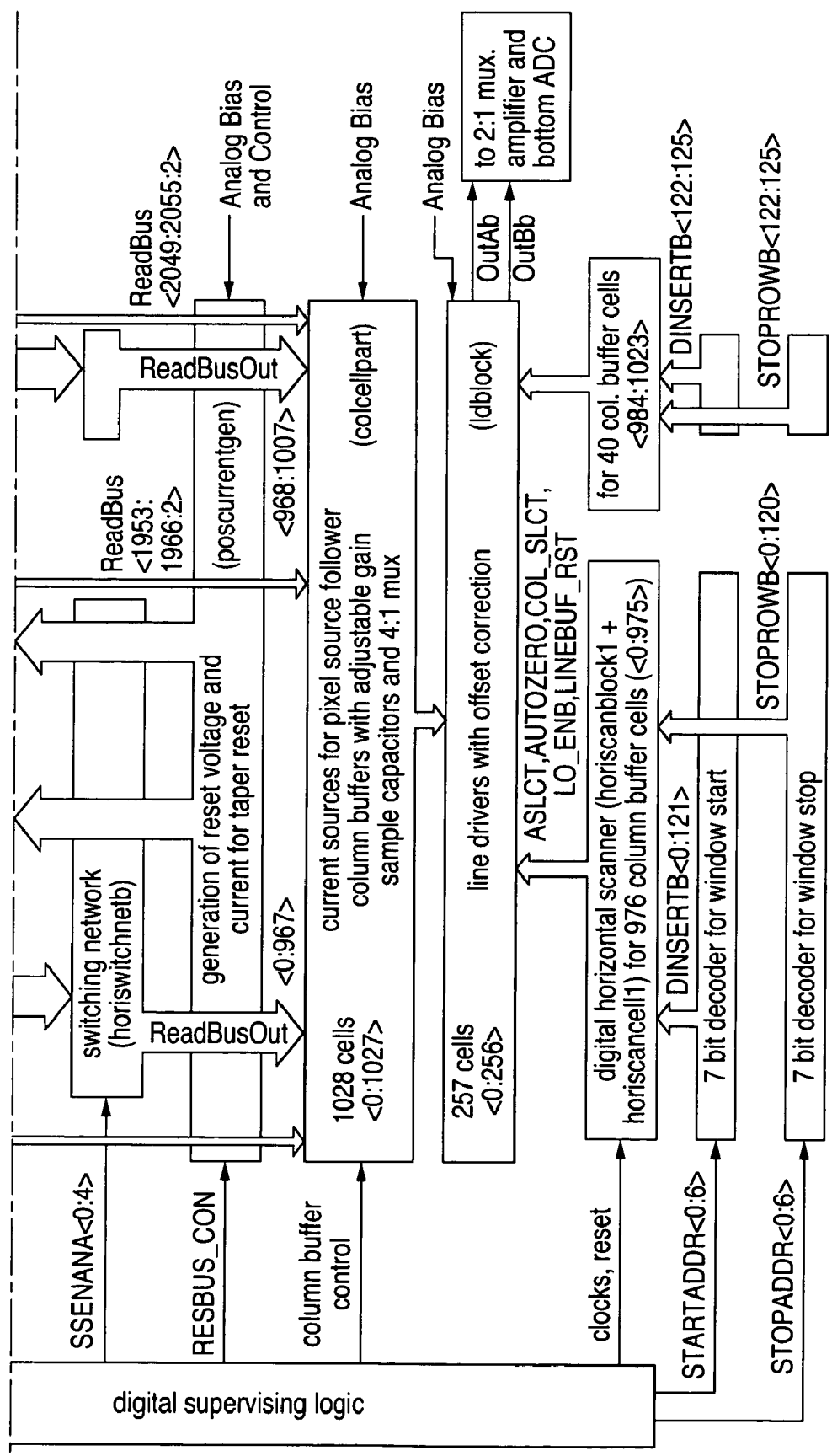

FIG. 4 shows the basic block diagram 400 for a representative embodiment including peripheral circuits 402 to provide video for high definition television. FIG. 5 shows a detailed block diagram for the representative embodiment. The A/D converter is co-located in proximity to the rest of the circuitry such that any transmission path between the A/D converter and the other circuitry acts primarily as a resistance rather than a reactance.

Figure 2:
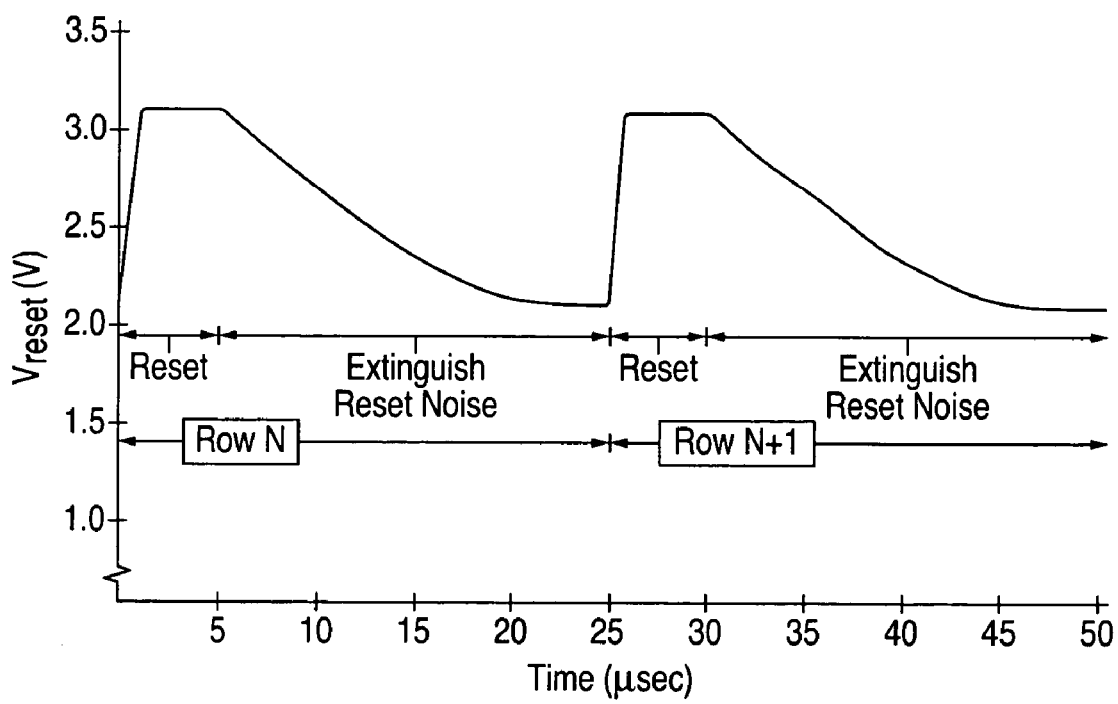
FIG. 2 is a signal diagram showing a representative clocking for a tapered-reset waveform for use with the present invention.
Figure 7:
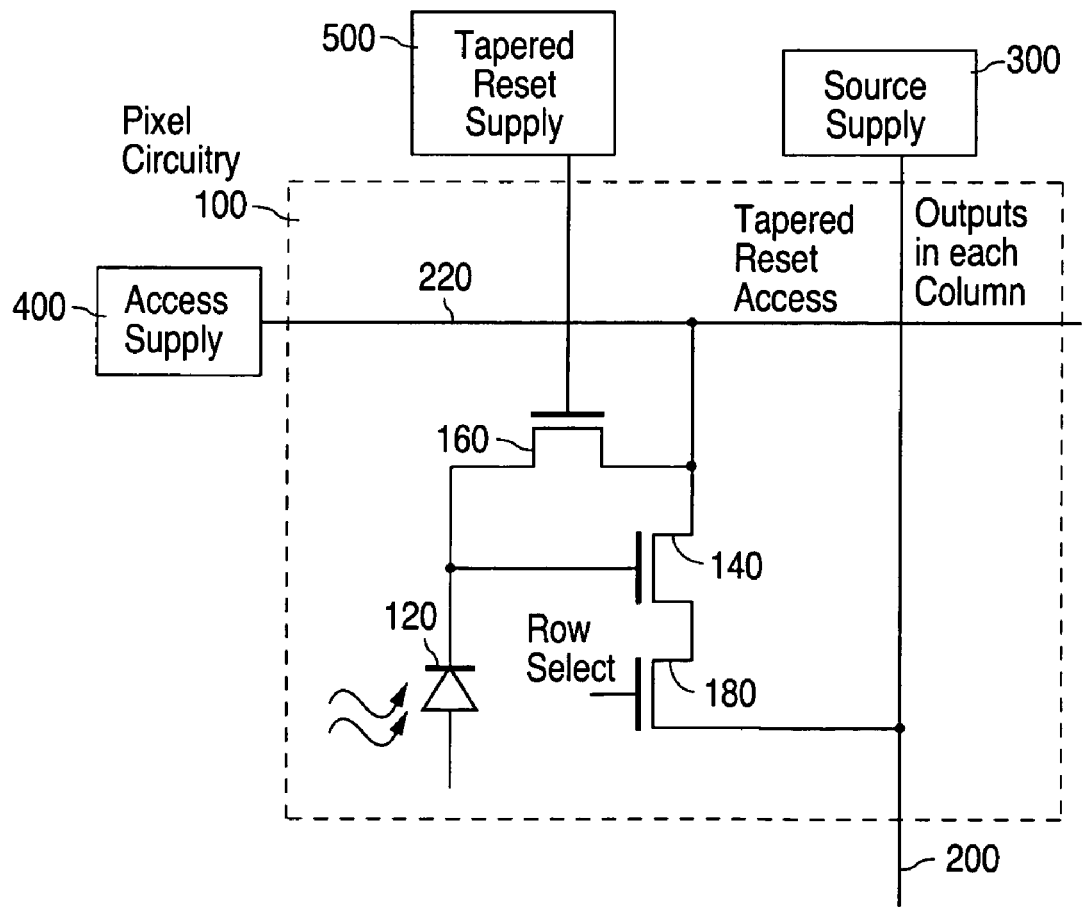
FIG. 7 is a pixel schematic of an embodiment of the present invention.

A low-noise active-pixel sensor 100 according to the present invention is illustrated in FIG. 7. Each pixel 100 in a sensor array comprises a photodetector 120, such as a photodiode, for example, connected to the gate of MOSFET 140, and one leg of a reset MOSFET 160. In this circuit, all the MOSFETs have the same polarity (i.e. all are N-type MOSFETs in the preferred embodiment). The other leg of reset MOSFET 160 is connected to a leg of MOSFET 140 and a leg of access MOSFET 180. The row select MOSFET 180 has one leg connected to MOSFET 140 and the other leg connected to columns bus 200. Column bus 200 connects all the pixels in a column of the photodetector array by way of the row select MOSFET 180 to a source supply 300. Row bus 220 connects all the pixel resets in a row to an access supply 400. Tapered reset supply 500 supplies an optimized active-pixel reset waveform (FIG. 2) to the gate of MOSFET 160.

Figure 8:
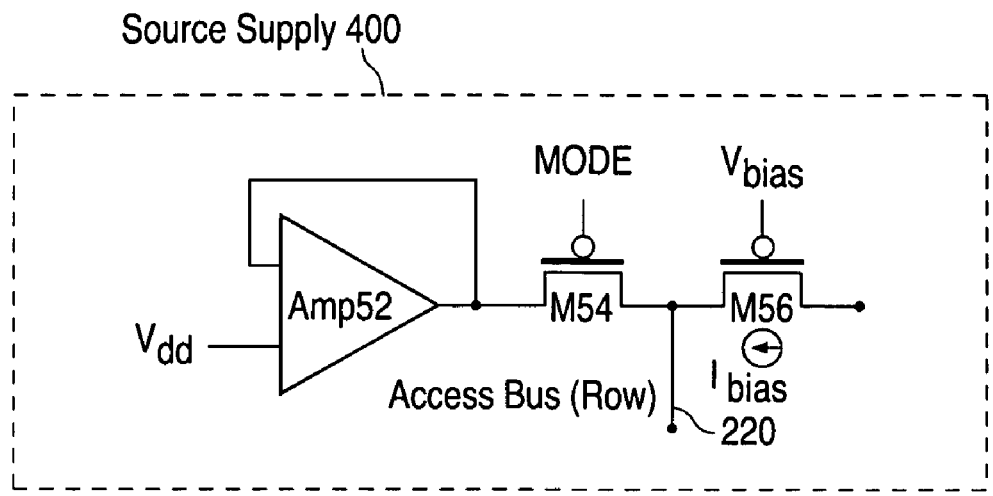
FIG. 8 is a diagram of an embodiment of the access supply.

The Access Supply 400 is a current source that comprises a distributed feedback amplifier, when connected to with the pixel MOSFETs. As shown in further detail in FIG. 8, Access Supply 400 may comprise bias transistor M56 and Mode transistor M54. M54 is disabled when MODE is set high so that M56 forms a distributed cascaded inverting amplifier with the transistors in the pixel. When MODE is set low, $V_{dd}$ sets the pixel transistors to operate as a source follower.

Photodiode 120 may be a substrate diode, for example, with the silicide cleared. In this embodiment, it is necessary to clear the overlying silicide because it is opaque to visible light. Pixel 100 is designed to obtain the largest available light detecting area while providing broad spectral response, control of blooming and signal integration time, and compatibility with CMOS production processes.

For maximum compatibility with standard submicron CMOS processes, photodiode 120 may be formed at the same time as the lightly doped drain (LDD) implant of n-type MOSFETs for the chosen process; this creates an n-on-p photodiode junction in the p-type substrate. Since no additional ion implantation is necessary, the process and wafer cost for active-pixel circuit 100 are the same as those of standard, high volume digital electronic products.

Figure 9:
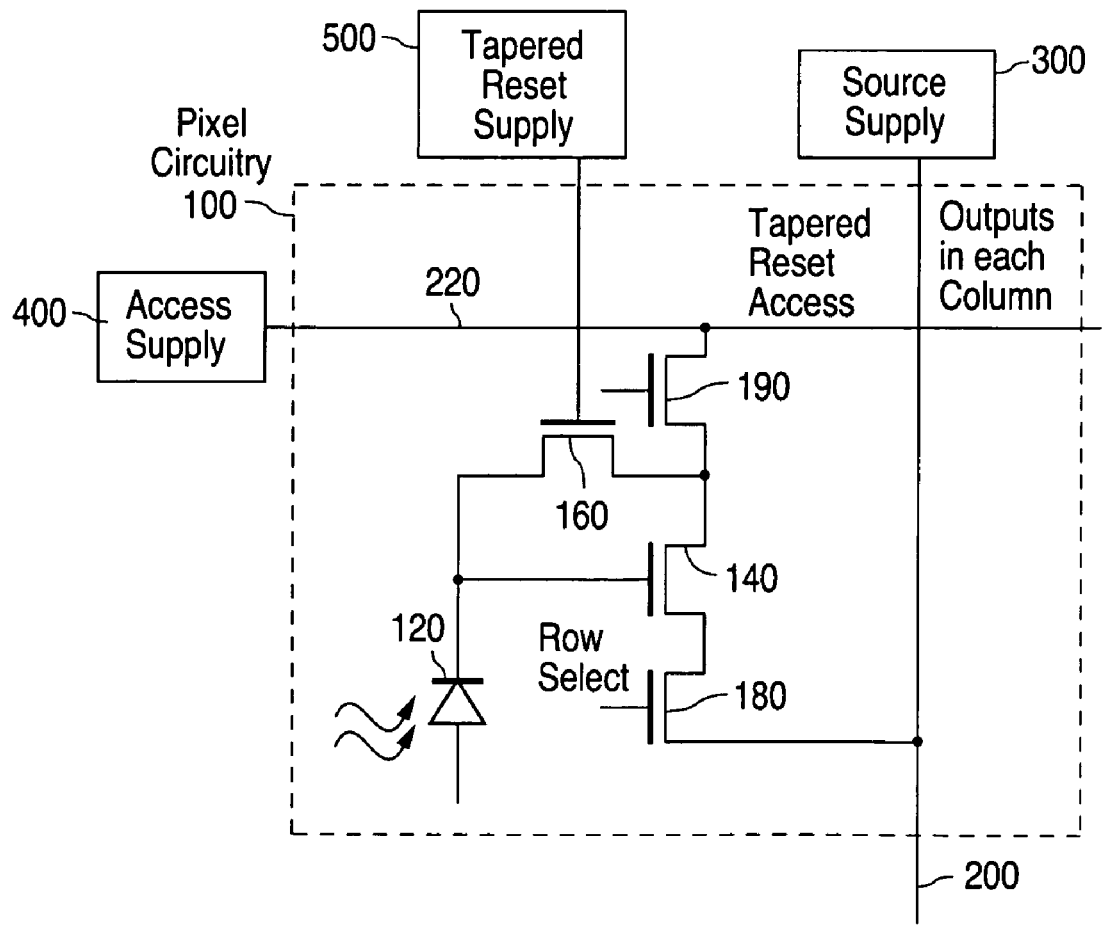
FIG. 9 is a pixel schematic of an alternative pixel circuit of the present invention.

The application of the tapered reset waveform (FIG. 2) to the amplifier enables the reset noise (kTC noise) envelope to decay before the reset MOSFET 160 is completely opened. The invention also reduces the fixed-pattern offsets from MOSFET 140 in each pixel because the photodiode node charges to a voltage that completely cancels both kTC noise and MOSFET 140 pixel-to-pixel variations within tens of microseconds. By adding a fourth transistor to produce a cascaded inverter, a row is resettable without noise to within several microseconds for full noise suppression, or a shorter time for less noise reduction. The alternative embodiment comprising 4 transistors is shown in FIG. 9, the operation of which is disclosed in related U.S. patent application Ser. No. 10/675,854, entitled LOW NOISE CMOS AMPLIFIER, filed Sep. 30, 2003, the disclosure of which is herein incorporated by reference.

The column bus 200 is preferably monitored by a standard column buffer such as disclosed in U.S. Pat. No. 5,892,540 to read the video signal when it is available. The key requirements on the column buffer are similar to conventional designs having to handle voltage-mode signals and are well known in the art.

Figure 6:
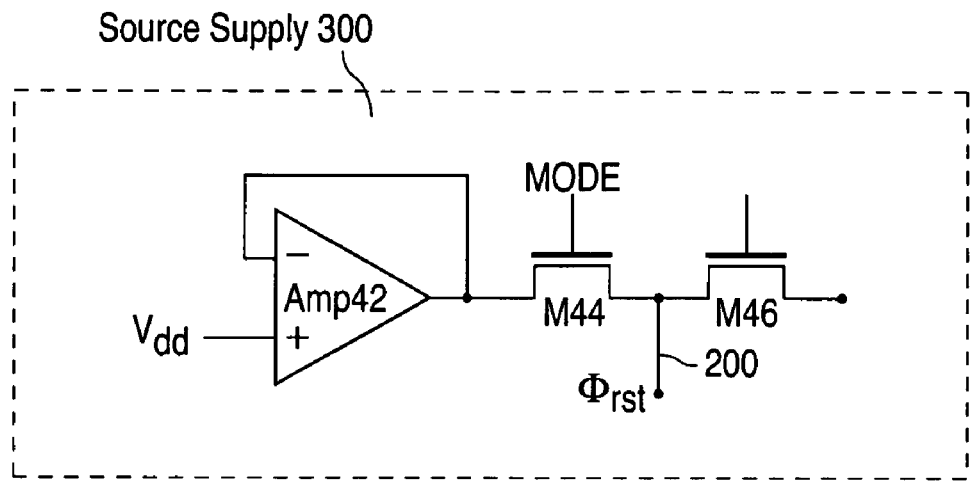
FIG. 6 is a schematic circuit diagram illustrating an embodiment of a column-based source supply circuit for use with the present invention.

The reset clock signal (FIG. 2), for circuit 100, and the clocking of source supply 300 (FIG. 6) which facilitate active-pixel reset and readout, is generated on-chip using standard CMOS digital logic. This digital logic scheme thus enables "windowing," wherein a user can read out the imager in various formats simply by enabling the appropriate support logic to clock the appropriate subformat. With windowing, the 1920 by 1080 format of the prototype embodiment can be read out as one or more arbitrarily sized and positioned M by N arrays without having to read out the entire array. For example, a user might desire to change a computer-compatible "VGA" format (i.e., approximately 640×480) to either Common Interface Format (CIF; nominally 352×240) or Quarter Common Interface Format (QCIF; nominally 176×120) without having to read out all the pixels in the entire array. This feature simplifies support electronics to reduce cost and match the needs of the particular communication medium. As an example, a personal teleconference link to a remote user having only QCIF capability could be optimized to provide QCIF resolution and thus reduce bandwidth requirements throughout the teleconference link. As a further example, an imager configured on Common Interface Format (CIF) could provide full-CIF images while supplying windowed information for the portions of the image having the highest interest for signal processing and data compression. During teleconferencing the window around a person's mouth (for example) could be supplied more frequently than the entire CIF image. This scheme would reduce bandwidth requirements throughout the conference link.

Figure 10:
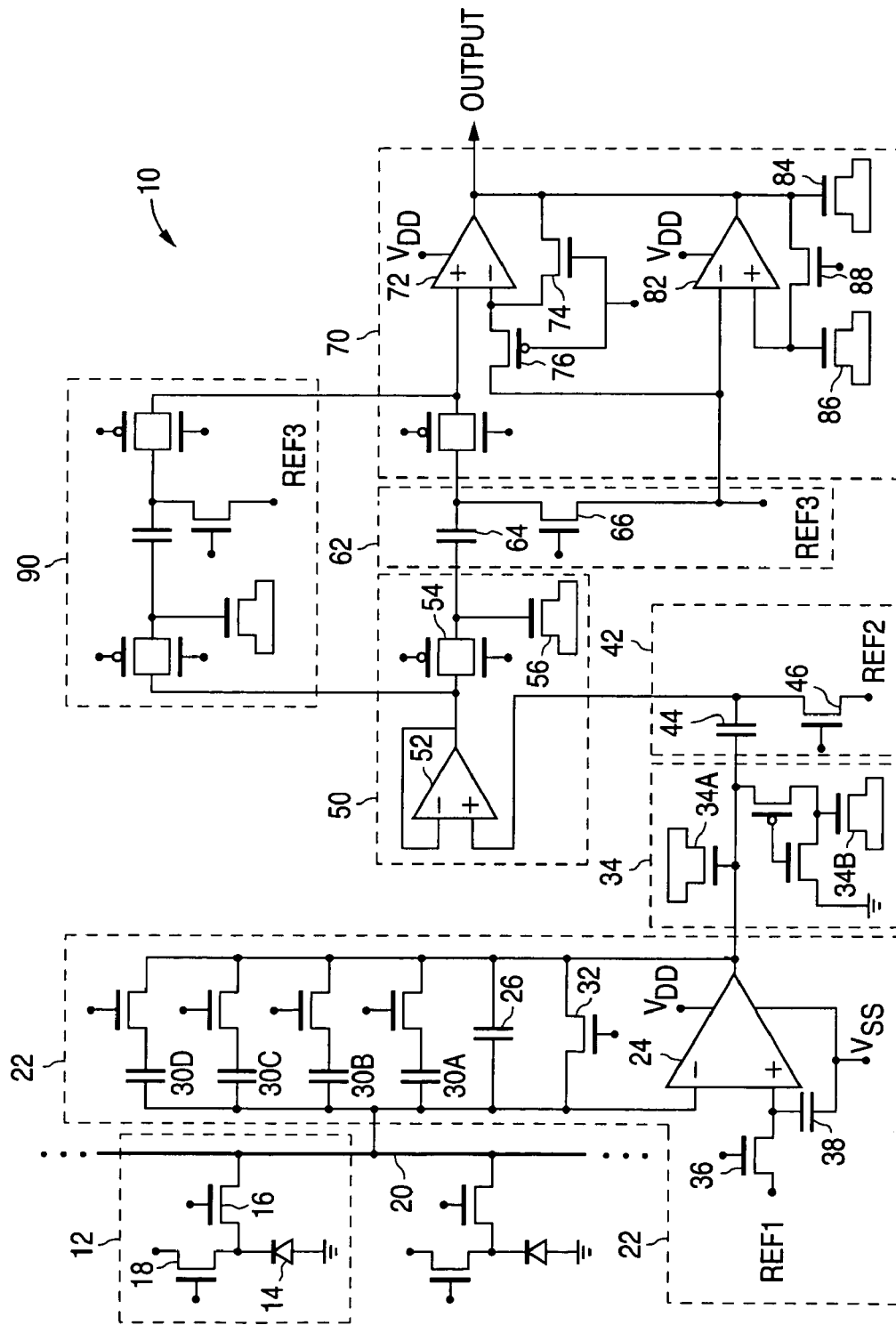
FIG. 10 is a schematic of a prior art column buffer for use with the present invention.

A preferred embodiment of the present invention has the approximate design values when incorporated in a pixel having 5 μm by 5 μm real estate in 0.25 μm CMOS process technology:

Mosfet 180: W=0.48 μm and L=0.34 μm
Mosfet 160: W=0.48 μm and L=0.42 μm
Mosfet 140: W=0.6 μm and L=0.50 μm
Photodiode 120: $C_{det}$=5.5 fF In the preferred embodiment, the signals from photodetectors 120 are read out one row at a time, from bottom to top of the array. Within each row, photodetectors 120 are read out from left to right. Readout is initiated by turning on the access MOSFETs 160 of all the photodetectors 120 in a selected row. This connects each photodetector 120 in the selected row to its corresponding column bus 200. Each column bus 200 is connected to a charge integrating amplifier circuit, which comprises a capacitive transimpedance amplifier (CTIA) 22 as shown in FIG. 1 of U.S. Pat. No. 5,892,040 (reproduced here as FIG. 10). Thus, the photocharge from each row-selected photodiode 14 is transferred to its corresponding CTIA 22 by its column bus 20.

Capacitive transimpedance amplifier (CTIA) 22 includes a high gain, wide bandwidth, CMOS differential amplifier 24 with a small feedback capacitor 26 connected in parallel to form a charge amplifier. The sensitivity of CTIA 22 can be adjusted by selecting one or more gain-setting, parallel feedback capacitors 30A–30D, in any combination, with the minimum feedback capacitance 26. A reset switch 32 connected across the parallel feedback capacitors allows the signal (i.e., the photo-generated charge) to be cleared from CTIA 22 after it has been read. An optimum load capacitance 34 (which may include a semiconductor capacitance 34A and a switchable semiconductor capacitance 34B) is connected to the output of CTIA 22 and can be selected as required to limit the bandwidth and thus control noise, particularly the broadband channel noise of CTIA 22.

The positive (+) (noninverting) terminal of differential amplifier 24 can be connected to a low noise reference (REF1). REF1 is typically generated on-chip by a bandgap reference circuit (for lowest possible temporal noise) and sampled by a sample-and-hold (S/H) circuit consisting of a MOSFET switch 36 and a capacitor 38. By sampling reference voltage REF1, wideband noise of the reference is band-limited to the Nyquist bandwidth established by the S/H clock frequency. In an alternative embodiment, the noninverting (+) terminal of each differential amplifier 24 (i.e., one amplifier for each column in a two-dimensional imaging array, as explained above) is connected to the averaged signal from a set of "black" reference pixels (constituting REF1 in this embodiment) to suppress column-to-column offsets and other common mode noise. Each "black" reference pixel comprises a standard pixel that is covered with light-absorbing material so that its output is generated primarily by dark signal mechanisms. This configuration provides low spatial noise by removing the noise associated with column-to-column offsets at the front end of CTIA 22.

In a preferred embodiment of system 100, two correlated double sampling circuits are used to improve circuit sensitivity. A first correlated double sampling circuit 42 includes a series capacitor 44 connected between the output of CTIA 22 and a clamp switch 46. Immediately after a passive pixel (such as pixel 12) has been read and reset, clamp switch 46 is connected to a reference (REF2) and CTIA 22 is held at reset (with reset switch 32 closed). Capacitor clamp switch 46 is released (opened) only after reset switch 32 is opened and CTIA 22 is allowed to settle. Thus, when CTIA 22 is at its final reset level, the far side of capacitor 44 will be at the reference level REF2. Temporal reset noise associated with column bus capacitance and amplifier 24 is suppressed at this point.

The far terminal of capacitor 44 is connected to a buffer stage 50 comprising a unity gain buffer amplifier 52, a CMOS sample-and-hold (S/H) switch 54, and a S/H capacitor 56. A second correlated double sampling circuit 62 includes a series capacitor 64 connected between S/H buffer 50 (the sampled-and-held output of CTIA 22) and a clamp switch 66 to suppress column-to-column fixed pattern noise. At the start of each frame, when the settled reset signals from the "black" pixels are read out through the signal processing chain comprising CTIA 22, clamp circuit 42, and S/H buffer 50, clamp switch 66 connects series capacitor 64 to a reference (REF3). Capacitor clamp switch 66 is released (opened) only after reset switch 32 has been opened, CTIA 22 has been allowed to settle, and clamping switch 46 has been opened. Thus, when CTIA 22 is at its settled reset level, the far side of capacitor 64 will be at reference level REF3. Column-to-column pattern noise is suppressed at this point.

The far terminal of capacitor 64 is connected to an offset cancellation circuit 70, which includes a main amplifier 72 comprising a single stage transconductor with a high output impedance connected to an output bus. A unity gain buffer is obtained by connecting the output of amplifier 72 to its inverting (−) input through feedback connection offset switch 74, unhooking REF3 by means of reference switch 76, and connecting the photocharge signal from clamp circuit 62 to the noninverting (+) input. Threshold adjustment is obtained by placing a low transconductance amplifier 82 in parallel with main amplifier 72. To cancel the offset, amplifier 72 is put in a high gain mode by opening a feedback connection switch 74. The inverting (−) input to amplifier 82 is tied to reference voltage REF3, and the output is connected to filter capacitor 84 and sample capacitor 86 through offset switch 88. Amplifier 82 thus generates a current to cancel the unbalance current of main amplifier 72. The correction voltage is trapped on capacitor 86, and main amplifier 72 is restored to its unity gain configuration. This technique of offset cancellation of the output bus driver is further described in Degrauwe et al., "A Micropower CMOS-Instrumentation Amplifier," IEEE Journal of Solid-State Circuits, Vol. SC-20, No. 3, pp. 805–807 (June 1985).

As an option, the output of buffer amplifier 52 may be connected, by the addition of at least one parallel circuit 90, to an analog pipeline that includes at least two parallel branches. Circuit 90 is simply a duplicate of the sample-and-hold (S/H) and correlated double sampling circuits that it parallels. With appropriate switching, pipelined sample-and-hold circuitry allows a photodetector signal from the currently selected row of the photodetector array to be transferred to CTIA 22 while data from the previously selected row is being multiplexed onto the output bus. Final multiplexing may be used to distribute the red, green, and blue signals.

Figure 11:
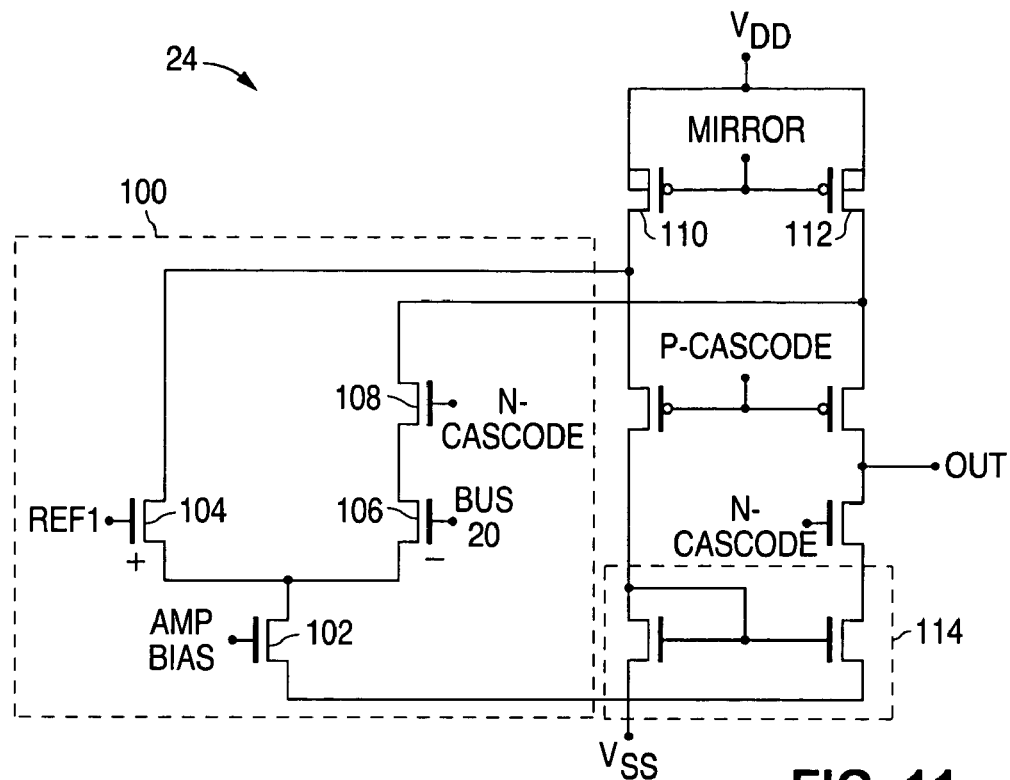
FIG. 11 is a schematic of a prior art differential amplifier for use with the column buffer of FIG. 10.

As further illustrated in FIG. 11, a preferred embodiment of differential amplifier 24 comprises a folded cascode architecture that maximizes the closed-loop drive capability, adequately settles the signal independent of parametric variations, minimizes Miller capacitance of the charge-integrating stage, minimizes amplifier noise, and provides robust signal-handling capability in a mixed-signal environment. Core amplifier stage 100 comprises differencing n-type amplifier FETs 104 and 106 in combination with current source n-FET 102. Current source FET 102 is internally set by AMP BIAS to sink 20 μA, for example, for operation at video frame rates. Amplifier stage 100, with cascoded negative leg comprising n-FET 108, drives a folded cascode current mirror active load 114. A pair of p-FETs 110 and 112 comprise balanced current sources that supply a quiescent bias current of 12 μA at video frame rates, and by setting MIRROR at the appropriate bias level, amplifier load 114 sinks approximately 2 μA for each leg. The reduced current in active load 114 enhances open-loop gain as compared to other differential amplifier schemes, which require additional chip "real estate" to achieve similar performance gains. This type of differential amplifier 24 is necessary in a low noise system in order to suppress both 1/f and broadband noise while simultaneously increasing gain.

The design of amplifier 24 illustrated in FIG. 11 avoids generation of fixed pattern noise from subtle signal fluctuations. Amplifier 24 also provides adequate power supply rejection and immunity to possible clocking noise from collocated signal-processing circuitry, and its robust properties enable column-to-column partitioning of low noise CTIAs 22 as pixel pitch is reduced below 20 μm. In preferred embodiments of system 10 having 10 μm pixel pitch in the horizontal direction, alternating columns of pixels may be serviced by low noise CTIAs 22 having column buffers (laid out in 20 μm pitch) that are alternately located along the top and bottom of the imaging area. With this scheme, the signals read from alternating columns are split between the top and bottom banks of CTIAs 22.

In the present invention, all clock signals for circuit 10, including pixel access and reset, charge integrating amplifier readout and reset, correlated double sampling, and column offset cancellation, are generated on-chip using standard CMOS digital logic.

The respective outputs from each column buffer are multiplexed onto a common bus and then fed to one or more high-speed A/D converters that are closely collocated to effectively remove transmission line effects. The common bus thus effectively mimics a simple wire rather than a complex transmission line that requires careful impedance matching. By using as few A/D converters as possible, and as few as one, the power efficiency of the digitization system is maximized.

Conventional logic would suggest that the A/D conversion should be performed off-chip to keep the power dissipation of this functional block from heating the image sensor and thereby generating dark current at each pixel. Excess dark current degrades sensor performance with respect to dynamic range and S/N ratio. Excess dark current also shortens the maximum exposure time. Standard practices also suggest that foundry-supplied CMOS process technologies are incompatible with achieving 12-bit pixel S/N ratio or producing low-power 12-bit A/D converters.

Many low-noise pixel designs hence use CCD-like signal processing at each pixel to target 12-bit performance. Since practical matters limit the achievable S/N ratio with these and other designs, most CMOS sensors with on-chip digitization hence support, at most, 10 bit resolution. Conventional CMOS sensor designs with on-chip A/D converters hence often use 8 to 10-bit A/D conversion at each column since this selection matches the typically achievable pixel S/N ratio with the typically producible A/D converter. Pixel-based digitization is being taught where oversampling extends, in principle, the digitization range to beyond 10 bits—if the pixel and supporting image sensor architecture support such high performance. Column-wise A/D conversion is also taught as useful for direct digital correlated double sampling as described by Gowda in U.S. Pat. No. 6,115,066 and earlier by Ludwig (SPIE 1097, 1987) and Chen, among others.

In the present invention, the 5 μm by 5 μm pixel in 0.25 μm CMOS has detector capacitance of about 5.5 fF and supports saturation charge of about 50,000 electrons with minimum noise <3 e−. The maximum dynamic range is hence 50,000/3=16,000:1 or about 14 bits. The true ≧12 bit performance of the pixel and the supporting column buffer hence require digitization at resolution up to 14 bits to support maximum image sensor performance. Commercially available digital still cameras with CCD sensors, however, empirically prove that practical matters with respect to the analog interface between the CCD and the supporting electronics limit such means to resolution of 12 bits at the common maximum video frequency of 28 MHz. The key practical matter involves the cabling between the image sensor and the off-chip A/D converter. In order to increase resolution and/or video frequency, a shift in technology is required.

Targeting a video frequency of 74.125 MHz to support high-definition television, for example, engineering calculations conclude that settling the analog video signal to 1 part in 32,800 to support 14 bit digitization requires 10.4 time constants for commensurate rise time of 1.3 ns. The concomitant wavelength of the maximum bandwidth of interest is 38.7 cm. A conservative rule of thumb for transmission line engineering hence dictates that the video line between the video buffer and the supporting A/D converter must be treated as a transmission line and properly terminated when longer than $1/16^{th}$ of the bandwidth wavelength, or 2.4 cm. This is roughly the size of an image sensor and is typically shorter than the effective electrical distance between a conventional CCD sensor's analog video tap and its supporting A/D converter. The best-designed image sensor modules are therefore compact and place the A/D near the sensor using surface mount technology and as few printed circuit vias or cable interconnects as possible to minimize adding parasitic inductance. The added inductance and resistance of vias and sockets create classic pi-networks that effectively increase the electrical length of the video line and thereby increase the likelihood of ringing in the video signal. Ringing increases the settling time, which degrades the sampled resolution of the video signal.

Similar consideration for the electrical length of the video signal transmitted from the video sensor over typical media such as the metal lines in the sensor or traces in the supporting printed circuit board lead to a similar conclusion. Since the typical time delay in air is 80 ps per inch and 140 ps per inch for a PC board trace, the electrical length of a signal with 1.3 ns time constant is 9.2 inches. To avoid transmission line effects the length of the signal line between the analog video buffer and the supporting A/D converter must be less than $1/16^{th}$ of 9.2 inches, or 1.5 cm.

Contrary to conventional wisdom, digitization support to levels of 12 and 14 bits at frequencies above those typically used today thus mandates on-chip integration of the $\geq 12$ bit A/D converter. In particular, image sensors supporting HDTV thus require on-chip digitization to avoid performance loss.

Maximizing performance thus dictates using one or a few A/D high-speed converters located within 1.5 cm of the image sensor's high-speed video buffer. This short length and complementary need to minimize stray inductance thus dictate that the A/D conversion must be on-chip.

Collocating the A/D converter on the sensor also enables optimized transmission line characteristics of the short wire to further preclude the introduction of deleterious artifacts in the video signal that increase the excess noise. The unit length capacitance of an LSI wire is approximately (see Gao; 2000 SIGDA {Special Interest Group on Design Automation; www.sigda.org} Proceedings):

$$C_{tot} = C_o W + C_f$$

where Co is 4 nF/cm, W is the width of the metal trace and $C_f$ is the fringing capacitance 0.58 pF per cm. The unit length inductance is approximated:

$$L_{self} = \frac{\mu_o}{2\pi} \ln\left(\frac{8T_{tot}}{W} + \frac{W}{4T_{tot}}\right)$$

where $T_{tot}$ is the distance between metal line and groundplane and $\mu_o$, is the magnetic permeability. By placing the video line in the third metal layer, using 4 µm trace width, and deep submicron CMOS technology, then the metal conductor thickness is about 0.6 µm and the intermetal dielectric is about 1 µm thick. The resulting fringing capacitance, $C_f$, is 0.58 pF per cm, $C_o$ is 4 nF per cm to the underlying metal, $C_{tot}$ is 2.17 pF/cm and $L_{self}$ is 4.22 nH/cm. The characteristic line impedance is consequently designed in the deep submicron VLSI chip to be:

$$Z_0 = \sqrt{\frac{L_{self}}{C_{tot}}} = \sqrt{\frac{4.22 \times 10^{-9}}{2.17 \times 10^{-12}}} \approx 50\Omega$$

The characteristic line impedance of the short video line thus closely approximates the desired value for optimizing signal transmission. The characteristic line impedance can similarly be alternatively set to approximately 75 ohms, such as by reducing the trace width to about 1.5 µm. This narrow width increases the line resistance because the metal layer resistivity is typically on the order of $\leq 100$ m$\Omega$/square. This specific design thus further limits the distance to the A/D converter to also optimize series resistance.

Figure 12:
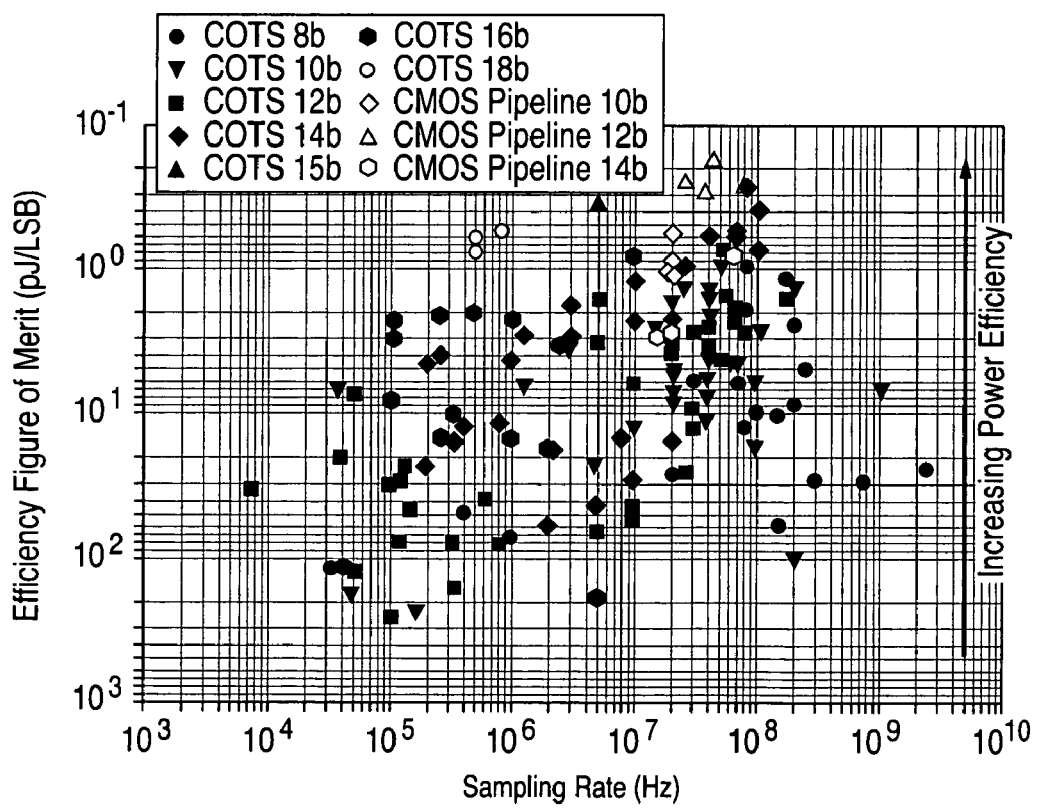
FIG. 12 is a plot showing the power efficiency achieved with A/D converters operating at sampling frequencies from kHz to GHz.

Consideration for minimizing camera power also supports using one or a few A/D converter(s) located on-chip. Analysis of A/D converter power efficiency shows that high-speed conversion, specifically via pipeline architecture, facilitates the highest power efficiency. FIG. 12 compares the power efficiency in terms of pJoule/LSB. The most efficient architecture is shown to place the A/D conversion at the highest possible frequency needed to support the image sensor's video rate.

Those skilled in the art will appreciate that various adaptations and modifications of the just described preferred embodiments can be configured without departing from the scope and spirit of the invention. Therefore, it is to be understood that, within the scope of the appended claims, the invention may be practiced other than as specifically described herein.

What is claimed is:

1. A CMOS imager system comprising:
   an active pixel sensor;
   a column buffer connected to the active pixel sensor;
   an analog-to-digital (A/D) converter co-located with the active pixel sensor and column buffer; and
   an analog programmable gain amplifier connected between the column buffer and the A/D converter, such that a transmission path between the analog programmable gain amplifier and the A/D converter acts primarily as a resistance, rather than a reactance.

2. The CMOS imager system of claim 1, wherein the active pixel sensor comprises an access supply, a tapered reset supply and a source supply.

3. The CMOS imager system of claim 2, wherein the A/D converter is a high-speed converter have 12 bit or greater resolution.

4. The CMOS imager system of claim 3, wherein the column buffer has gain and fixed-pattern noise (FPN) suppression.

5. The CMOS imager system of claim 4, wherein the analog programmable gain amplifier has tunable electronic bandwidth.

6. A digital video system comprising:

an active pixel sensor;

a column buffer connected to receive an output from the active pixel sensor;

an analog programmable gain amplifier connected to the column buffer;

an analog-to-digital (A/D) converter connected to the analog programmable gain amplifier and co-located with the active pixel sensor, column buffer and analog programmable gain amplifier, such that a transmission path between the analog gain amplifier and the A/D converter acts primarily as a resistance, rather than a reactance;

a digital programmable gain amplifier connected to an output of the A/D converter; and a digital video interface connected to an output of the digital programmable gain amplifier.

7. The digital video system of claim 6, wherein the active pixel sensor comprises an access supply, a tapered reset supply and a source supply.

8. The digital video system of claim 7, wherein the A/D converter is a high-s.

9. The digital video system of claim 8, wherein the column buffer has gain and fixed-pattern noise (FPN) suppression.

10. The digital video system of claim 9, wherein the analog programmable gain amplifier has tunable electronic bandwidth.

11. A CMOS imager system comprising:

an active pixel sensor;

a column buffer connected to the active pixel sensor;

a high-speed analog-to-digital (A/D) converter, the A/D converter having greater than or equal to 12 bit resolution, co-located with the active pixel sensor and supporting multiple column buffers; and an analog programmable gain amplifier connected between the column buffer and the A/D converter, such that a transmission path between the analog programmable gain amplifier and the A/D converter acts primarily as a resistance, rather than a reactance.

12. The CMOS imager system of claim 11, wherein the active pixel sensor comprises an access supply, a tapered reset supply and a source supply.

13. The CMOS imager system of claim 12, wherein the column buffer has gain and fixed-pattern noise (FPN) suppression.

14. The CMOS imager system of claim 13, wherein the analog programmable gain amplifier has tunable electronic bandwidth.

* * * * *